(12) United States Patent
Ye et al.

(10) Patent No.: US 6,528,855 B2
(45) Date of Patent: Mar. 4, 2003

(54) MOSFET HAVING A LOW ASPECT RATIO BETWEEN THE GATE AND THE SOURCE/DRAIN

(75) Inventors: Qiuyi Ye, Hopewell Junction, NY (US); William Tonti, Essex Junction, VT (US); Yujun Li, Poughkeepsie, NY (US); Jack A. Mandelman, Stormville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/911,894

(22) Filed: Jul. 24, 2001

(65) Prior Publication Data

US 2003/0020120 A1 Jan. 30, 2003

(51) Int. Cl.[7] ............................................. H01L 29/772
(52) U.S. Cl. ...................................... 257/401; 257/377
(58) Field of Search ............................... 257/301, 374, 257/507, 506, 510, 524, 401, 377

(56) References Cited

U.S. PATENT DOCUMENTS 4,927,777 A * 5/1990 Hsu et al.
6,277,707 B1 * 8/2001 Lee et al.

* cited by examiner

Primary Examiner—Nathan J. Flynn
Assistant Examiner—Kevin Quinto
(74) Attorney, Agent, or Firm—Lerner, David, Littenberg, Krumholz & Mentlik, LLP

(57) ABSTRACT

A MOSFET having a new source/drain (S/D) structure is particularly adapted to smaller feature sizes of modern CMOS technology. The S/D conductors are located on the shallow trench isolation (STI) to achieve low junction leakage and low junction capacitance. The S/D junction depth is defined by an STI etch step (according to a first method of making the MOSFET) or a silicon etch step (according to a second method of making the MOSFET). By controlling the etch depth, a very shallow junction depth is achieved. There is a low variation of gate length, since the gate area is defined by etching crystal silicon, not by etching polycrystalline silicon. There is a low aspect ratio between the gate and the S/D, since the gate conductor and the source and drain conductors are aligned on same level. A suicide technique is applied to the source and drain for low parasitic resistance; however, this will not result in severe S/D junction leakage, since the source and drain conductors sit on the STI.

2 Claims, 7 Drawing Sheets

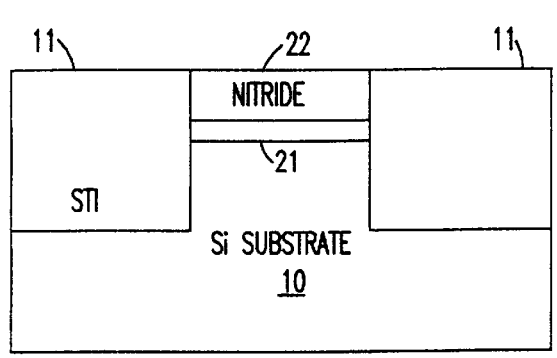
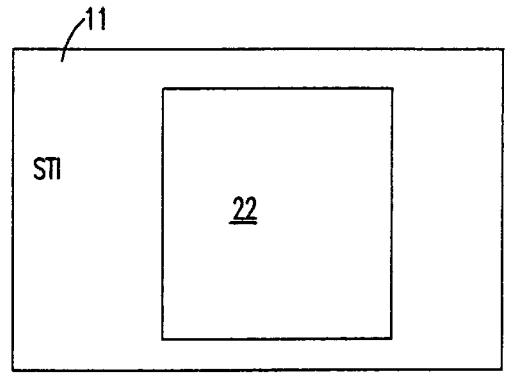
FIG. 2A                    FIG. 2B
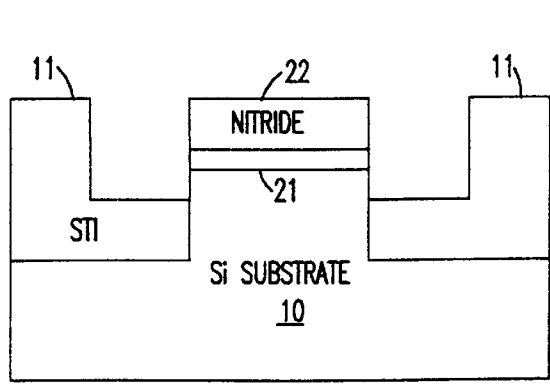
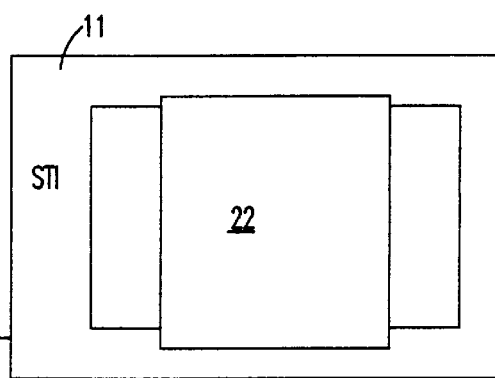
FIG. 3A                    FIG. 3B

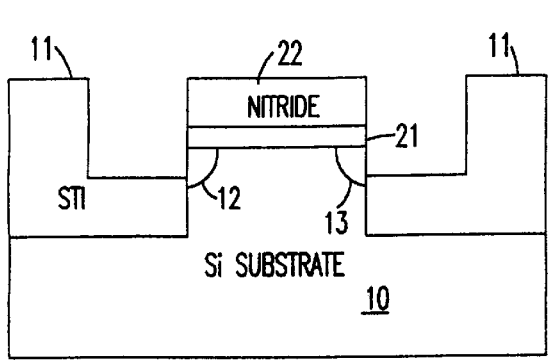
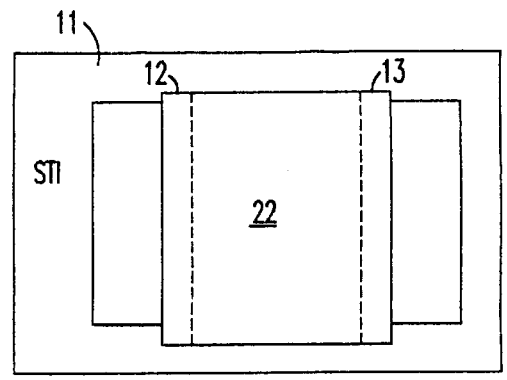
FIG. 12A  FIG. 12B
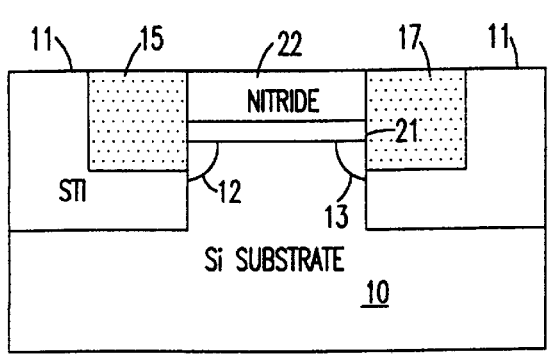
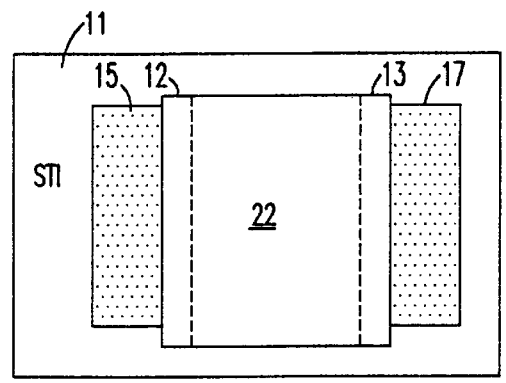
FIG. 13A  FIG. 13B

MOSFET HAVING A LOW ASPECT RATIO BETWEEN THE GATE AND THE SOURCE/DRAIN

FIELD OF THE INVENTION

The present invention generally relates to metal oxide semiconductor field effect transistors (MOSFETs) and, more particularly, to a novel MOSFET with a new source/drain structure exhibiting low junction leakage and low junction capacitance.

BACKGROUND OF THE INVENTION

The feature sizes of integrated circuit (IC) complementary metal oxide semiconductor (CMOS) devices continue to shrink. This reduction in size requires careful engineering of the source and drain structures of CMOS devices. In particular, what is needed is a shallower junction, lower parasitic resistance and lower junction capacitance.

SUMMARY OF THE INVENTION

It is therefore an object of the present invention to provide a novel MOSFET having a new source/drain structure and methods for making the same.

According to the invention, there is provided a novel MOSFET structure with a new source/drain (S/D) structure. The S/D conductors are located on the shallow trench isolation (STI) to achieve low junction leakage and low junction capacitance. The S/D junction depth is defined by an STI etch step (according to a first method of making the invention) or a silicon etch step (according to a second method of making the invention). By controlling the etch depth, a very shallow junction depth is achieved. There is a low variation of gate length, since the gate area is defined by etching crystal silicon, not by etching polycrystalline silicon. There is a low aspect ratio between the gate and the S/D, since the gate conductor and the source and drain conductors are aligned on same level. In other words, the gate conductor, and the source and drain conductors are arranged in substantially the same plane. As used herein, the term "aspect ratio" is understood to mean the ratio of the depth to the width of a trench in the semiconductor substrate. A silicide technique is applied to the source and drain for low parasitic resistance; however, this will not result in severe S/D junction leakage, since the source and drain conductors sit on the STI.

BRIEF DESCRIPTION OF THE DRAWINGS

The foregoing and other objects, aspects and advantages will be better understood from the following detailed description of a preferred embodiment of the invention with reference to the drawings, in which:

FIG. 2A is a cross-sectional view showing the first step in making the new MOSFET structure according to a first method;

FIG. 2B is a top view showing the first step of FIG. 2A;

FIG. 3A is a cross-sectional view showing the second step in making the new MOSFET structure according to a first method;

FIG. 3B is a top view showing the second step of FIG. 3A;

FIG. 12A is a cross-sectional view showing the fourth step in making the new MOSFET structure according to a second method;

FIG. 12B is a top view showing the fourth step of FIG. 12A;

FIG. 13A is a cross-sectional view showing the fifth step in making the new MOSFET structure according to a second method; and FIG. 13B is a top view showing the fifth step of FIG. 13A.

DETAILED DESCRIPTION OF A PREFERRED EMBODIMENT OF THE INVENTION

Figure 1A:
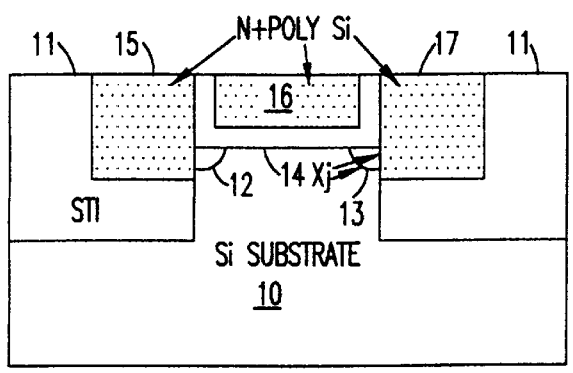
FIG. 1A is a cross-sectional view of the new MOSFET structure.
Figure 1B:
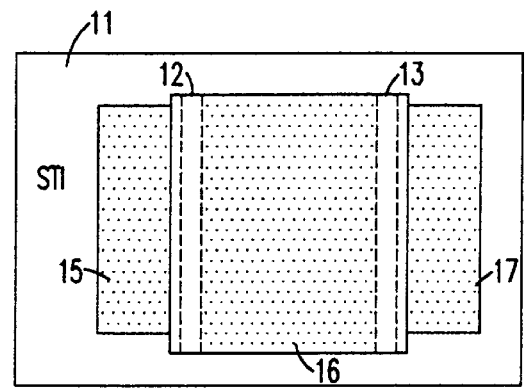
FIG. 1B is a top view of the new MOSFET structure.

Referring now to the drawings, and more particularly to FIGS. 1A and 1B, there is shown a cross-sectional view and a top view of an n-type MOSFET structure according to the present invention. While an n-type MOSFET structure is shown and described, those skilled in the art will understand that a p-type MOSFET structure can be made based on the teachings of this invention.

The structure shown in FIGS. 1A and 1B is formed in a silicon substrate 10 and isolated by shallow trench isolation (STI) 11. The source 12 and the drain 13 are formed on either side of the oxide gate 14. Doped N+ polycrystalline silicon is used for the source conductor 15, the gate conductor 16 and the drain conductor 17. The source and drain (S/D) conductors 15 and 17 are located on STI 11 to achieve low junction leakage and low junction capacitance. The S/D junction depth (Xj) is defined by an STI etch step (according to a first method of making the invention) or a Si etch step (according to a second method of making the invention). By controlling the etch depth, a very shallow junction depth is achieved. There is a low variation of gate length, since the gate area is defined by etching crystal silicon, not by etching polycrystalline silicon. There is a low aspect ratio between the gate 14 and the source 12 and drain 13, since the gate conductor 16 and the source and drain conductors 15 and 17 are aligned on same level. A silicide technique is applied to the source and drain for low parasitic resistance; however, this will not result in severe S/D junction leakage, since the source and drain conductors 15 and 17.sit on the STI 11.

In the first step of the manufacture of the device according to a first method is shown in FIGS. 2A and 2B. A pad oxide 21 is grown followed by depositing a pad nitride 22. The first step is to define the gate length and direction and source/drain (S/D) diffusion junction depth. This is done by first defining the gate area in the pad layers 21 and 22 by applying a photoresist and then patterning the photoresist in a lithography step. The thus defined gate area is transferred to the pad stack 21 and 22. The photoresist is then removed, and a silicon etch is performed to form the trench for the STI. The trench is then filled with high density plasma (HOP) deposited oxide and the surface is subjected to a chemical/mechanical polish (CMP) to level the STI 11 to the nitride 22.

In the next step, shown in FIGS. 3A and 3B, the source/drain contacts are defined. A photoresist is applied followed by a lithography step to define the source/drain contact areas. The STI 11 is etched selective to nitride in the source/drain contact areas to the desired junction depth. The photoresist is then removed.

Figure 4A:
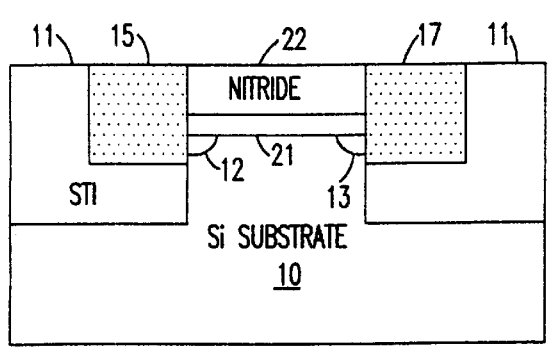
FIG. 4A is a cross-sectional view showing the third step in making the new MOSFET structure according to a first method.
Figure 4B:
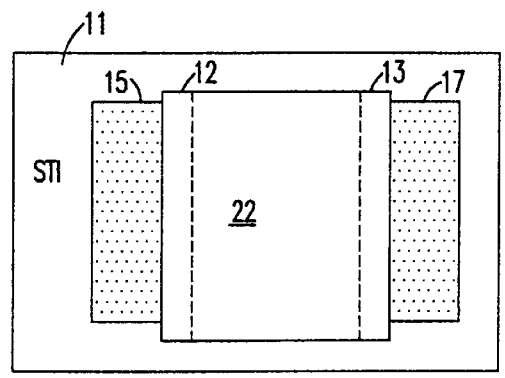
FIG. 4B is a top view showing the third step of FIG. 4A.

The third step, shown in FIGS. 4A and 4B, fills the S/D conductor and forms the S/D gate overlap region. This is done by first depositing highly doped polycrystalline silicon 15 and 17. The surface is then leveled to the gate nitride 22 by CMP processing. The structure is then subjected to a thermal process to out diffuse N+ dopant into the crystal silicon to form the S/D to gate overlap regions 12 and 13 as shown.

Figure 5A:
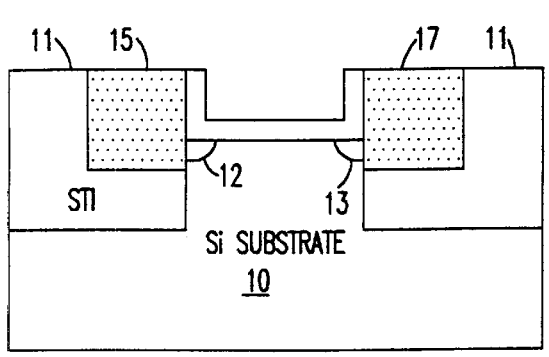
FIG. 5A is a cross-sectional view showing the fourth step in making the new MOSFET structure according to a first method.
Figure 5B:
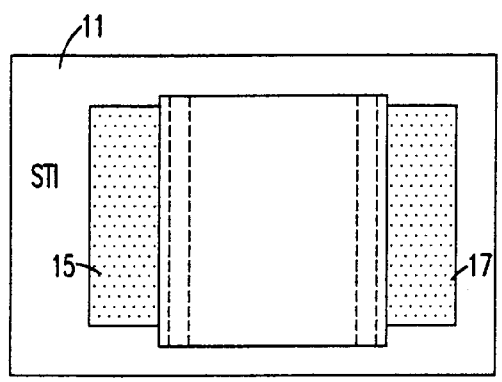
FIG. 5B is a top view showing the fourth step of FIG. 5A.

Next, channel engineering is performed and isolation formed between S/D and gate in FIGS. 5A and 5B. First, the nitride 22 and oxide 21 are etched to isolate the S/D and gate. This is followed by thermally growing an oxide which results in the bottom oxide and polycrystalline silicon oxide located on the two sides, as shown in FIG. 5A. This is followed by a channel Vt implant through the resulting bottom oxide.

Figure 6A:
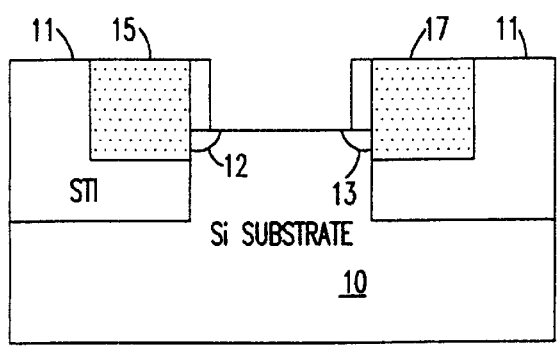
FIG. 6A is a cross-sectional view showing the fifth step in making the new MOSFET structure according to a first method.
Figure 6B:
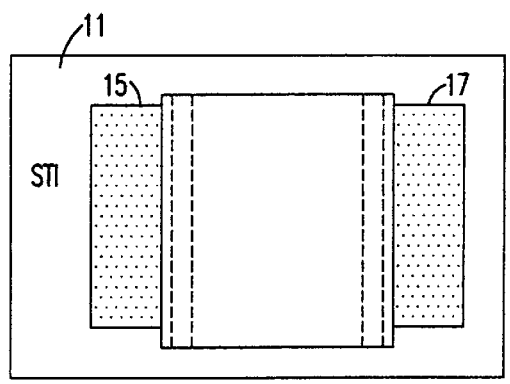
FIG. 6B is a top view showing the fifth step of FIG. 6A.

In FIGS. 6A and 6B, a spacer etch is performed to clean the gate area. This is performed with a reactive ion etch (RIE) process which will clean the gate area, while leaving spacers of polycrystalline silicon oxide on the two sides. This prepares the device for the next step.

Figure 7A:
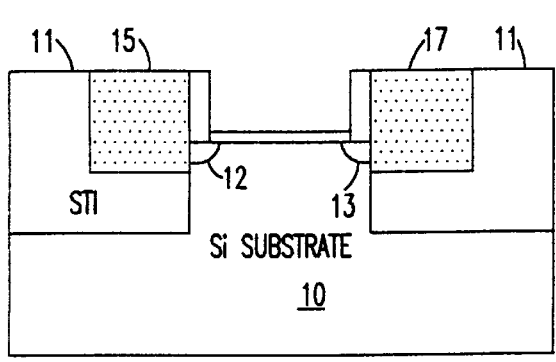
FIG. 7A is a cross-sectional view showing the sixth step in making the new MOSFET structure according to a first method.
Figure 7B:
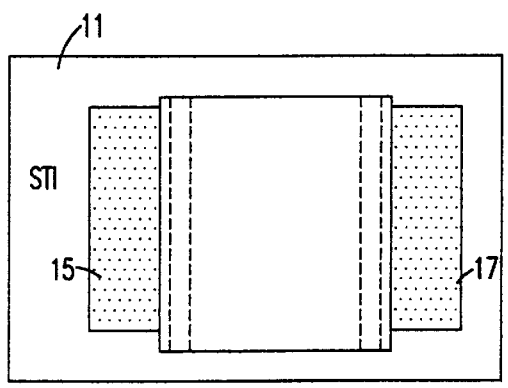
FIG. 7B is a top view showing the sixth step of FIG. 7A.

In FIGS. 7A and 7B, the gate oxide is grown. Since a high quality oxide is needed for the gate oxide, the oxide removed by the RIE process is replaced by the oxide grown in this step.

Figure 8A:
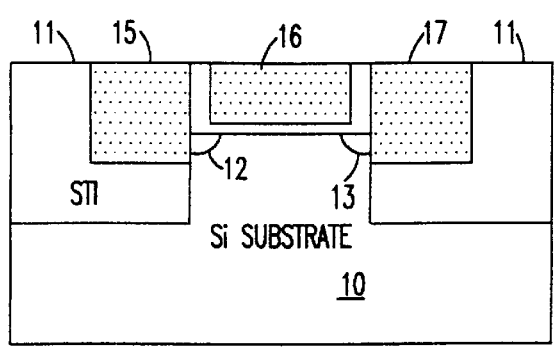
FIG. 8A is a cross-sectional view showing the seventh step in making the new MOSFET structure according to a first method.
Figure 8B:
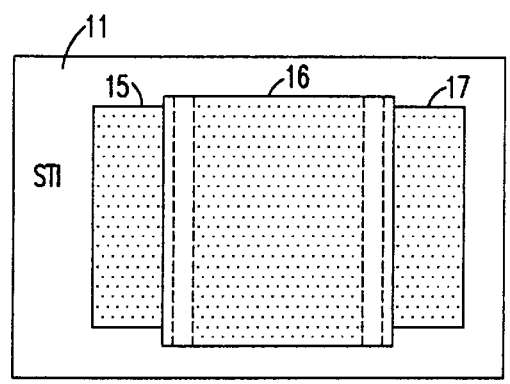
FIG. 8B is a top view showing the seventh step of FIG. 8A.

Finally, in FIGS. 8A and 8B, the gate conductor (gate polycrystalline silicon) fill is performed. This is followed by silicide on the gate and S/D conductor and metal wiring (not shown) of the gate and source and drain.

One of the key processes is how to control junction depth (Xj). In FIG. 4A, Xj is controlled by etching into the STI oxide. The second method of manufacturing the novel MOSFET structure of FIG. 1 will now be described. This second method provides another approach which achieves better Xj control.

Figure 9A:
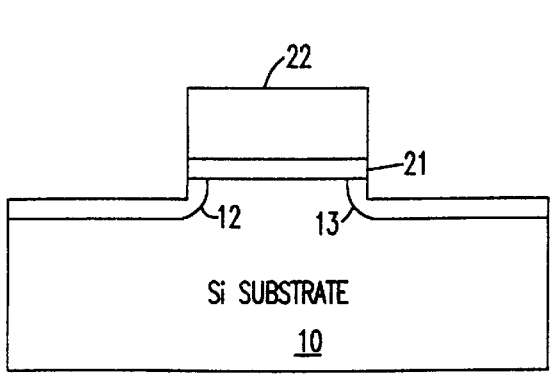
FIG. 9A is a cross-sectional view showing the first step in making the new MOSFET structure according to a second method.
Figure 9B:
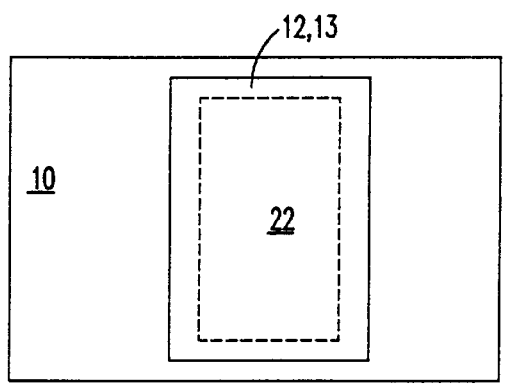
FIG. 9B is a top view showing the first step of FIG. 9A.

The first step in the second method is shown in FIGS. 9A and 9B. In this step, the gate area and direction are defined along with the source/drain diffusion junction depth. The process begins similarly to that of FIG. 2A except that the silicon etch is not performed at this time for the trench for the STI. After growing the pad oxide 21 and depositing the pad nitride 22, the silicon substrate 10 is etched to the desired S/D junction depth. A N+ polycrystalline silicon or arsenic glass is deposited. The structure is subjected to a thermal process to out diffuse N+ dopant to form source/drain overlap 12 and 13 under the gate, as shown in FIG. 9A. The highly doped polycrystalline silicon or arsenic glass is then removed.

Figure 10A:
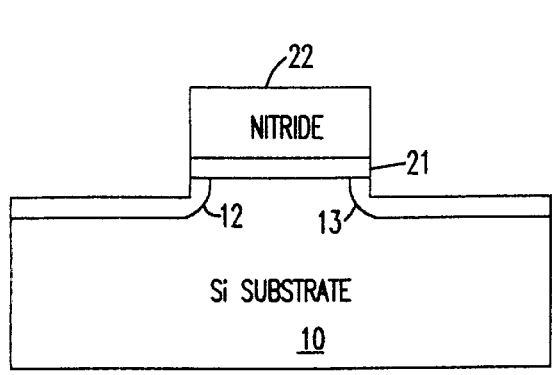
FIG. 10A is a cross-sectional view showing the second step in making the new MOSFET structure according to a second method.
Figure 10B:
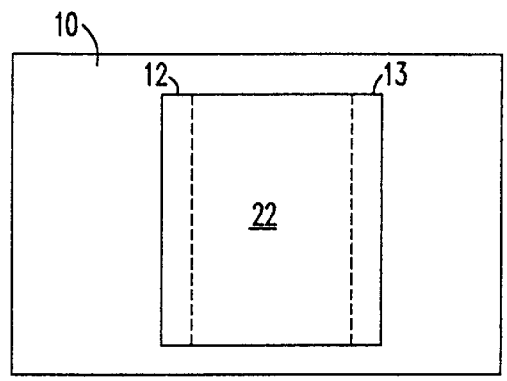
FIG. 10B is a top view showing the second step of FIG. 10A.

The second step, shown in FIGS. 10A and 10B, is to define the active area of the MOSFET in the width direction. A photoresist is applied, and a lithography step is performed to define the area. The nitride 22 and the underlying oxide 21 are then etched to achieve the structure shown in FIG. 10B. The photoresist is then removed.

Figure 11A:
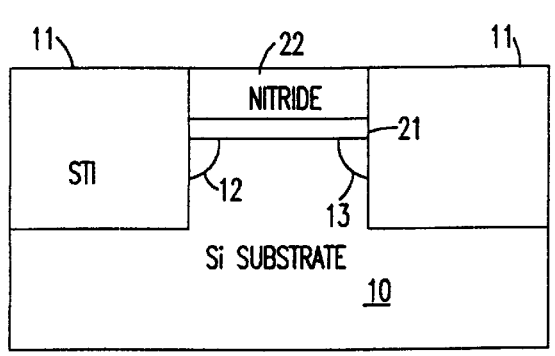
FIG. 11A is a cross-sectional view showing the third step in making the new MOSFET structure according to a second method.
Figure 11B:
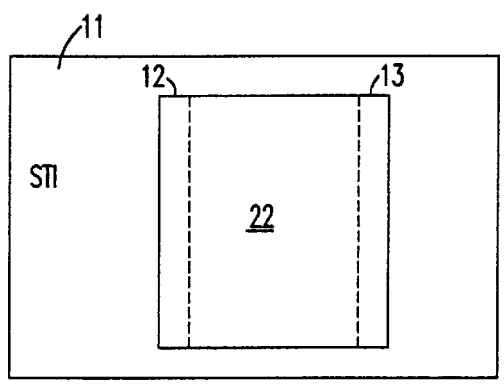
FIG. 11B is a top view showing the third step of FIG. 11A.

In the third step, shown in FIGS. 11A and 11B, the STI is formed. The silicon substrate 10 is etched selective to the pad nitride 22 to form the trench for the STI. The trench is then filled with high density plasma oxide (HDP), and the surface is subjected to a chemical/mechanical polish (CMP) to level the STI 11 to the nitride 22, as was done in FIG. 2A.

The source/drain contact area is defined in FIGS. 12A and 12B. A photoresist is applied, followed by a lithography step to define the source/drain contact area. The STI II in source/drain contact area is then etched. Next, the photoresist is removed.

In the step shown in FIGS. 13A and 13B, the source/drain conductors 15 and 17 are filled in by depositing highly doped polycrystalline silicon or other highly conductive material (e.g., tungsten, TiN, WN, TaSiN, etc.). The surface is subject to a CMP process to level the surface to the gate nitride 22.

The remaining steps in the process according to the second method are the same as the steps shown in FIGS. 5 to 8 of the first method. The final step is applying silicide on gate and S/D conductors, followed by metal wiring (not shown) of gate and S/D.

What is claimed:

1. A MOSFET comprising:

source and drain (S/D) regions formed in a silicon substrate, the S/D junction depth is defined by etching into a shallow trench insulation (STI) to achieve a shallow junction depth;

a gate area defined by etching crystal silicon;

S/D conductors located on the STI to achieve low junction leakage and low junction capacitance, the S/D conductors each having a surface; and a gate conductor having a surface arranged in substantially the same plane as the surface of the S/D conductors, providing a low aspect ratio between the gate and the S/D.

2. The MOSFET recited in claim 1, further comprising a silicide applied to the source and drain for low parasitic resistance.

* * * * *